(12) United States Patent
Sinke et al.

(10) Patent No.: US 7,298,455 B2
(45) Date of Patent: Nov. 20, 2007

(54) LITHOGRAPHIC APPARATUS AND DEVICE MANUFACTURING METHOD

(75) Inventors: Arnold Sinke, Veldhoven (NL); Jan Hauschild, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 327 days.

(21) Appl. No.: 11/154,950

(22) Filed: Jun. 17, 2005

(65) Prior Publication Data

US 2006/0285099 A1    Dec. 21, 2006

(51) Int. Cl.
*G03B 27/52* (2006.01)
*G03B 27/72* (2006.01)
(52) U.S. Cl. .......................... 355/55; 355/71
(58) Field of Classification Search ................ 355/53, 355/55, 67, 71
See application file for complete search history.

(56) References Cited

U.S. PATENT DOCUMENTS

| 5,191,200 A | 3/1993 | Van der Werf et al. |
| 6,046,792 A | 4/2000 | Van Der Werf et al. |

*Primary Examiner*—Rodney Fuller
(74) *Attorney, Agent, or Firm*—Pillsbury Winthrop Shaw Pittman, LLP

(57) ABSTRACT

The present invention provides a lithographic apparatus, including: a substrate table constructed to hold a substrate; a projection system configured to project a radiation beam through an exposure slit area onto a target portion of the substrate; a patterning device configured to import the radiation beam with a pattern in its cross-section to form a patterned radiation beam, the patterned radiation beam at the target portion of the substrate being in focus over a depth of focus; and a measurement system that is arranged to measure a surface topography of at least part of the target portion, wherein the projection system is arranged to adjust a dimension of the exposure slit area to form an adjusted exposure slit area over which surface topography variations are equal to or smaller than the depth of focus.

17 Claims, 3 Drawing Sheets

LITHOGRAPHIC APPARATUS AND DEVICE MANUFACTURING METHOD

BACKGROUND

1. Field of the Invention

The present invention relates to a lithographic apparatus and a method for manufacturing a device.

2. Description of the Related Art

A lithographic apparatus may be used to apply a desired pattern onto a surface (e.g., a target portion of a substrate). Lithographic projection apparatus can be used, for example, in the manufacture of integrated circuits (ICs). In such a case, a patterning structure may generate a circuit pattern corresponding to an individual layer of the IC, and this pattern can be imaged by a projection system onto a target portion (e.g., comprising one or more dies and/or portion(s) thereof) of a substrate (e.g., a wafer of silicon or other semiconductor material) that has been coated with a layer of radiation-sensitive material (e.g., resist). In general, a single wafer will contain a whole matrix or network of adjacent target portions that are successively irradiated via the projection system (e.g., one at a time).

Among current apparatus that employ patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus—commonly referred to as a step-and-scan apparatus—each target portion is irradiated by progressively scanning the mask pattern under the radiation beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. A radiation beam in a scanning type of apparatus may have the form of a slit with a slit width in the scanning direction. More information with regard to lithographic devices as here described can be gleaned, for example, from U.S. Pat. No. 6,046,792, which is incorporated herein by reference.

As stated above, in a manufacturing process using a lithographic projection apparatus, a pattern (e.g., in a mask) is imaged onto a substrate that is at least partially covered by a layer of radiation-sensitive material (e.g., resist). Prior to this imaging procedure, the substrate may undergo various other procedures such as priming, resist coating, and/or a soft bake. After exposure, the substrate may be subjected to other procedures such as a post-exposure bake (PEB), development, a hard bake, and/or measurement/inspection of the imaged features. This set of procedures may be used as a basis to pattern an individual layer of a device (e.g., an IC). For example, these transfer procedures may result in a patterned layer of resist on the substrate. One or more pattern processes may follow, such as deposition, etching, ion-implantation (doping), metallization, oxidation, chemo-mechanical polishing, etc., all of which may be intended to create, modify, or finish an individual layer. If several layers are required, then the whole procedure or a variant thereof, may be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing," Third Edition, by Peter van Zant, McGraw Hill Publishing Co., 1997, ISBN 0-07-067250-4.

In the manufacturing process using a lithographic projection apparatus, a height map of the target portion that is to be exposed is measured. Based on these measurements, the position and/or the orientation of the substrate with respect to the optical elements is adjusted, e.g., by moving the substrate table on which the substrate is positioned. Since a substrate is not a perfectly flat object, it may not be possible to position the layer of resist exactly in the focal plane of the optics for the whole target portion, so the substrate may only be positioned as well as possible. In order to position the top surface of the substrate, or the layer of resist, in the focal plane as well as possible, the substrate table may be translated, rotated or tilted, in all degrees of freedom.

Adjusting the height and the tilt of the wafer table according to the surface topography of a substrate can level such changes in the topography. Non-correctable focus errors (NCE) are defined as changes in the wafer surface topography that cannot be completely compensated. For a static exposure, the non-correctable focus errors correspond directly to defocus errors. During a scanned exposure the non-correctable focus errors change continuously as the exposure slit is scanned over a particular position of the wafer. In the latter case, the average value of the non-correctable focus errors over the exposure time defines the average defocus that the position concerned experiences during the exposure.

SUMMARY

It is desirable to provide a lithographic apparatus having an improved compensation for wafer surface topography.

According to an embodiment of the invention, there is provided a lithographic apparatus, comprising: a substrate table constructed to hold a substrate; a projection system configured to project a radiation beam through an exposure slit area onto a target portion of the substrate; a patterning device being capable of imparting the radiation beam with a pattern in its cross-section to form a patterned radiation beam, the patterned radiation beam at the target portion of the substrate being in focus over a depth of focus (DOF); a measurement system that is arranged to measure a surface topography of at least part of the target portion, wherein the projection system is arranged to adjust a dimension of the exposure slit area to form an adjusted exposure slit area over which surface topography variations are equal to or smaller than the depth of focus.

In another embodiment of the invention, there is provided a lithographic projection apparatus arranged to project a pattern from a patterning device onto a substrate, wherein the projection system is arranged to maximize the dimension of the adjusted exposure slit area by reducing the dimension of the exposure slit area if the surface topography variations over the exposure slit area exceed the depth of focus.

In another embodiment of the invention, there is provided a lithographic apparatus, wherein the projection system is arranged to maximize the dimension of the adjusted exposure slit area by increasing the dimension of the exposure slit area if the surface topography variations over the exposure slit area are smaller than the depth of focus.

According to a further embodiment of the invention, there is provided a lithographic apparatus arranged to transfer a pattern from a patterning device onto a substrate, wherein the exposure slit area is substantially rectangular, having a width and a length dimension. Adjusting the dimension of the exposure slit area includes decreasing at least one of the width and the length dimension of the exposure slit area.

According to another aspect of the invention, there is provided a device manufacturing method comprising: projecting a patterned beam of radiation through an exposure slit onto a target portion of a substrate, which substrate is arranged on a substrate table constructed to hold the substrate, the radiation beam being in focus over a depth of focus (DOF); using a measurement system to measure a surface topography of at least part of the substrate; and adjusting at least one of a width and a length dimension of the exposure slit to the area over which height changes in the surface topography are equal to or smaller than the depth of focus.

According to an embodiment of the invention, there is provided a device manufacturing method comprising reducing the at least one of the width and the length dimension of the exposure slit to a size smaller than the distance over which the topography variation equals the depth of focus (DOF).

According to an embodiment of the invention, there is provided a method comprising the step of dividing an image in two or more parts before exposure.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
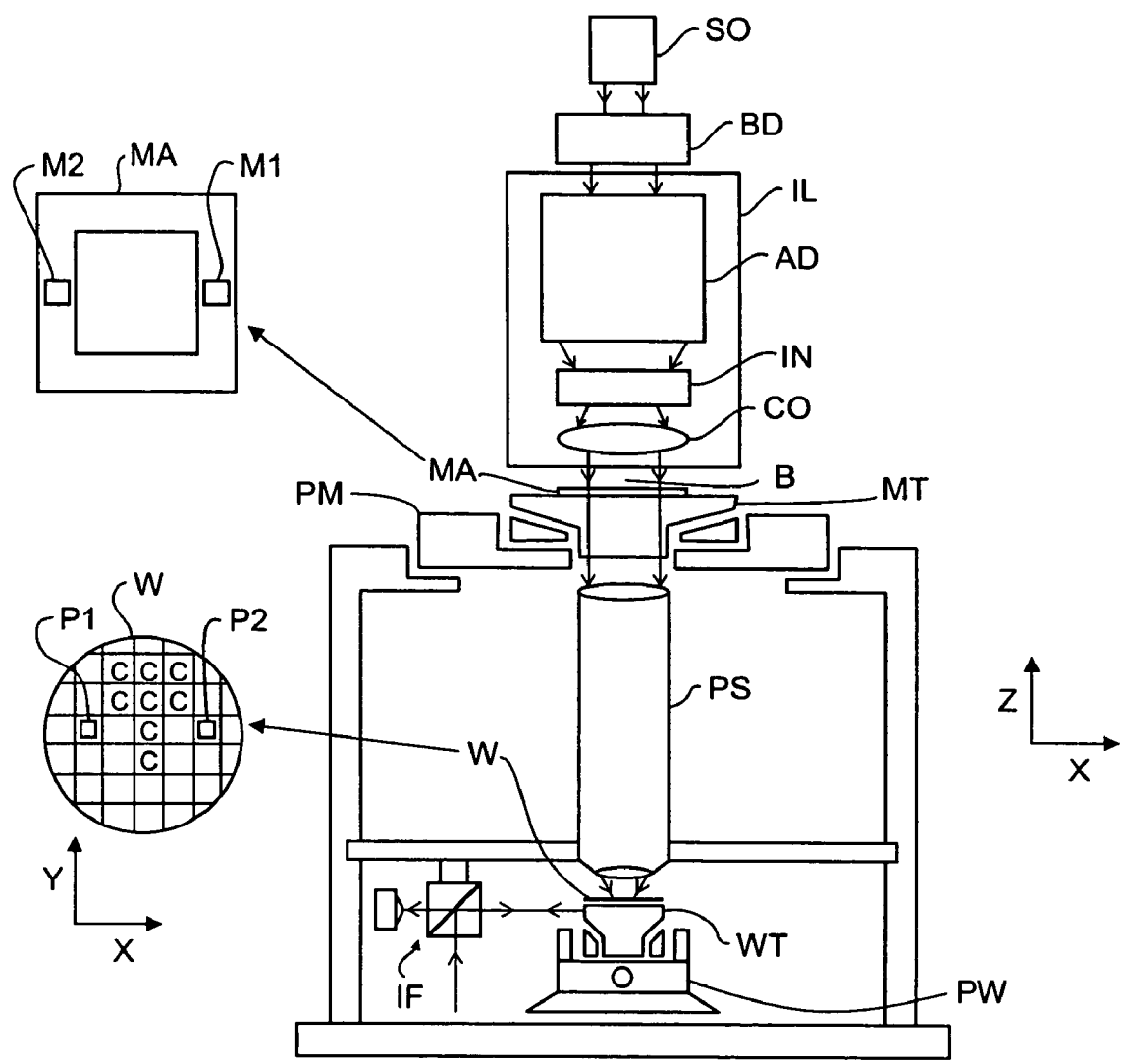
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g., UV radiation or any other suitable radiation), a mask support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section. The exposure slit is, following the illumination beam, one of the last parts of the radiation system. The exposure slit is for instance formed by blades, or REMA blades, that are movably arranged to leave open the exposure slit between them.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

In step mode, the mask table MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

In scan mode, the mask table MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Figure 2:
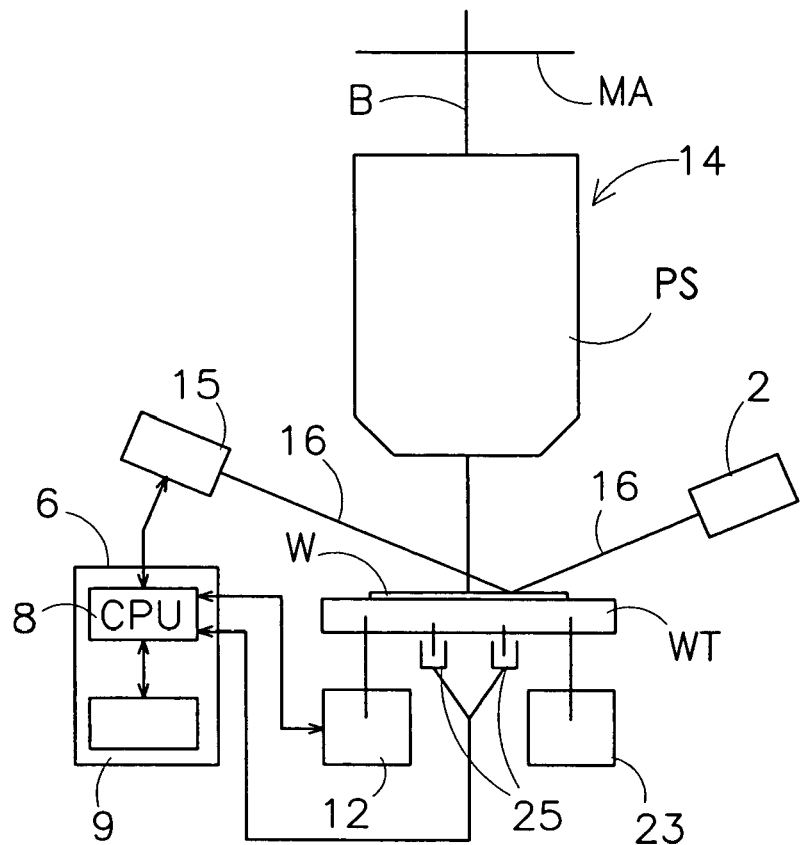
FIG. 2 schematically depicts part of a lithographic projection apparatus according to an embodiment of the invention.

In FIG. 2, a section 14 between the mask MA and the substrate table WT of the lithographic projection apparatus is shown. In the section 14, the so-called projection system PS (e.g., as shown in FIG. 1) is present. The projection system PS contains several elements to guide and condition the radiation beam B, as is known to persons skilled in the art. After passing the projection system PS, the projected radiation beam B hits the surface of the substrate W on the substrate table WT.

The substrate table WT is connected to actuators 12, 23. These actuators 12, 23 are connected to a control device 6 with a central processing unit (CPU) 8 and a memory 9. The central processing unit 8 further receives information from sensors 25 measuring the actual position of the wafer table WT or wafer table holder, e.g., electrically (capacitive, inductive) or optically (e.g., interferometrically, as shown in FIG. 1). The actuators 12, 23 controlled by the control device 6 are arranged to adjust the position of the wafer table WT in height and/or tilt, to position the surface of the wafer W in the focal plane of the optics.

The CPU 8 also receives input from a level sensor which measures the height and/or tilt information from the target area on the wafer where a radiation beam 16 hits the substrate surface. The level sensor may be, for example, an optical level sensor, comprising a sensor 15 or similar detection optics, a light source 2 for producing a radiation beam 16 and projection optics (not shown) (FIG. 2). In this specific case the level sensor 2, 15 produces eight spots 11 (FIG. 3) which have to be measured on the wafer W in order to determine the local height and tilt of an illuminated part of a target area. The sensor 15 generates a height dependent signal that is fed to the CPU 8. It will be appreciated that level sensors with an other number of spots may be applied instead. Alternatively, a pneumatic or capacitive sensor (for example) is conceivable.

It may be desirable for the sensor to be an optical level sensor making use of Moiré patterns formed between the image of a projection grating reflected by the wafer surface and a fixed detection grating, as described in U.S. Pat. No. 5,191,200. It may be desirable for the level sensor to measure the vertical height of a plurality of positions simultaneously and/or to measure the average height of a small area for each position, so averaging non-flatness of high spatial frequencies.

Figure 3:
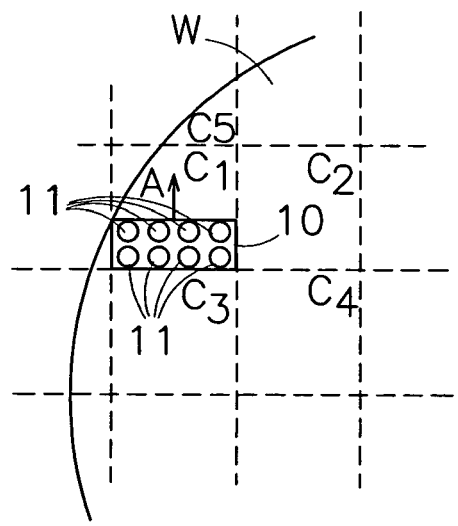
FIG. 3 schematically depicts a substrate divided in a number of target portions.

A level sensing method may use a multi-spot sensor 15 (for instance, 4 or 8 sensing areas) and measure the average height of a small area, such as an exposure slit 10, as is shown in FIG. 3, and will be further discussed below.

An average height map can be constructed that is used when determining the height map for areas on the substrate W that cannot be measured accurately by the level sensor. The average height map could be based on different information, such as the known shape of substrates W from a batch. Also, known effects of treatment steps supplied to the substrate W can be the basis for constructing an average height map, such as a method used to polish the substrate W. The average height map could further be based on a flatness map of the substrate table on which the substrate W is positioned. Even the curvature of an underlying stone curvature could be taken into account.

FIG. 3 schematically depicts a substrate W, divided in a number of target portions $C_i$ (i=1, 2, . . . ). The term substrate W used herein should be broadly interpreted as the usable area of the substrate W for exposures, e.g., excluding the focus edge clearance region.

Imaging a pattern onto a substrate W is usually done with optical elements, such as lenses or mirrors. In order to generate a sharp image, a layer of resist on the substrate should be in the focal plane of the optical elements. The surface of the substrate W is often curved. This curvature may be caused by the shape of the substrate W itself, but may also be caused by the treatment the substrate W has been subjected to, such as polishing, or may be caused by the underlying substrate stage to which the substrate W is clamped. The curvature could have different causes, so the curvature could subsequently have different shapes, i.e., in addition to second order effects the curvature may also include higher order effects.

To obtain information about the surface topography of the substrate W, the height differences (surface topography variations) of the target portion $C_i$ that is to be exposed is measured. Based on these measurements, the position and/or orientation of the substrate W with respect to the optical elements may be adjusted, e.g., by moving the substrate table on which the substrate W is positioned (not shown). Since a substrate W is not a perfectly flat object, it may not be possible to position the surface of the substrate W or the layer of resist exactly in the focal plane of the optics for the whole target portion $C_i$, so the substrate W may only be positioned as well as possible.

In order to position the top surface of the substrate W in the focal plane as well as possible, the substrate table may be translated, rotated or tilted.

In order to determine the best positioning of the substrate W with respect to the optical elements, the surface of the substrate W may be measured using a level sensor, as for instance described in U.S. Pat. No. 5,191,200, which is incorporated herein by reference in its entirety. This procedure may be done during exposure (on-the-fly), by measuring the part of the substrate W that is being exposed or is next to be exposed, but the surface of the substrate W may also be measured in advance (off-line). This latter approach can also be done at a remote position. In the latter case, the results of the measurements may be stored in the form of a so-called height map and used during exposure to position the substrate W with respect to the focal plane of the optical elements.

In both cases (on-the-fly and off-line), the top surface of the substrate W may be measured with a level sensor that determines the height of a certain area. This area may be an exposure slit 10, having a width about equal to the width of the target portion $C_i$ and having a length that is only part of the length of target portion $C_i$, as is shown in FIG. 3. The height map of a target portion $C_i$ may be measured by scanning the target portion $C_i$ in the direction of the arrow A. The level sensor determines the height of the substrate by applying a multi-spot measurement, such as for instance a 4- or an 8-spot measurement. The information on substrate surface topography is needed before exposing the substrate. Practical embodiments will be described below.

Embodiments of the present invention are concerned with the relation between productivity and yield on one hand, and turnover on the other. The lithographic system will become more accurate by applying a smaller exposure slit. In other words, exposing all fields with a smaller exposure slit size will increase the yield, as the accuracy increases by decreasing the number of non-correctable focus errors (NCE). This will however heavily impact, i.e., lower, the productivity. And a decrease in productivity implies a decrease in turnover. The present invention seeks to optimize this balance by providing a way of reducing the field or the size of the exposure slit only if the surface topography renders such reduction necessary, and increasing the slit size if possible, thus limiting the impact on productivity to a minimum. The exposure slit area is maximized within the limits of the surface topography, to prevent non-correctable focus errors and to maximize the productivity.

Figure 4:
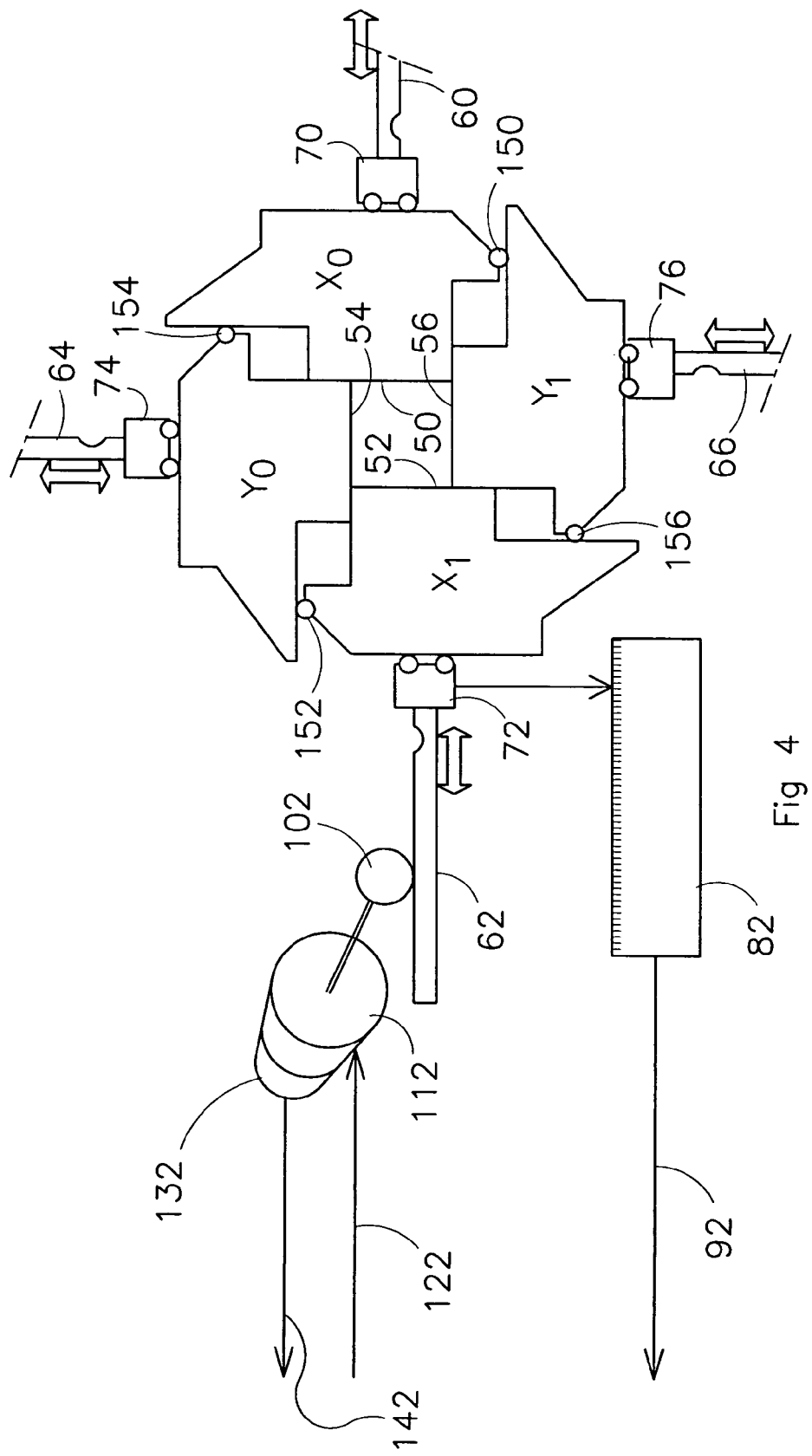
FIG. 4 schematically depicts an exposure slit according to an embodiment of the invention.

Inner edges 50, 52, 54, 56 of respective moveable blades X0, X1, Y0, Y1 (FIG. 4) determine the width and length dimensions of the exposure slit 10. The blades are also called REMA blades. The blades X0, X1, Y0, Y1 are arranged perpendicular to each other, thus forming the rectangular exposure slit therein between. The blades X0, X1, Y0, Y1 can move in respect to each other and are connected to drive beams 60, 62, 64, 66. At the ends thereof, the drive beams are provided with positioners 70, 72, 74, 76 that are slideable connected to the blades for positioning the blades X0, X1, Y0, Y1. To determine the position of the blades, the positioners are connected to blade position encoders. Only blade position encoder 82 is shown in FIG. 4. The blade position encoders provide counts 92 to a central processing unit, for determining the blade position. The drive beams 60, 62, 64, 66 are moveably connected to friction wheels 102 for moving the drive beams and thus the blades. The friction wheels 102 are rotateably connected to motor 112. The motor 112 is connected to an electrical power supply 122 and to a motor encoder 132. The motor encoder 132 sends counts 142 to the central processing unit, for determining the motor position.

To change the width of the exposure slit, blades X0 and X1 are moved towards or away from each other. To change the length of the exposure slit, the blades Y0 and Y1 are moved towards or away from each other. The blades may slide over each other, or partly slide over each other and partly roll against each other at the position of rolls 150, 154, 156, 156.

The wafer shape is measured before exposure the curvature of every field is known prior to the exposure, as described above. Topography variations may be compensated by adjusting the height or tilt of the wafer table. In some cases however the height changes of the wafer surface cannot be leveled effectively by adjusting the position and tilt of the wafer table.

According to embodiments of the present invention, the exposure of a field of the substrate can be done in multiple steps, exposing just part of the field in every exposure. This boils down to effectively dividing the field and reducing the size of the exposure slit to a size smaller than the distance over which the topography variation equals the depth of focus (DOF) of the lithography apparatus. Strongly curved fields are exposed having improved focussing. This results in an increased yield and a decrease of defective devices due to defocus errors. As mentioned before, simply reducing the exposure slit size and splitting up the field size for the complete substrate would lower the productivity, for instance by half. According to embodiments of the present invention, a field is only split up if needed to compensate for level changes in the surface topography. The size of the exposure slit is increased, or maximized if allowed by the surface topography. In practice, a standard slit size is used, which is decreased if necessary. If allowed by the height differences of the surface topography, the area of the exposure slit may also be increased.

In an embodiment of the apparatus and method of the present invention, the positioning of the wafer table is, during every exposure, optimized for that exposure. The wafer table is preferably positioned such that stitching of adjacent fields takes place on relatively insensitive patterning structures, such as scribe lanes or non-patterning lanes of the reticle.

Preferably the improvement, i.e., decreasing the number of non-correctable focus errors, is for scanners also done by reducing the size of the projected images in the non-scanning direction. Thus the non-correctable focus errors are reduced even further. Stitching the complete image in a number, for instance three or four, of parallel scans to expose a complete exposure area.

In practice, the non-correctable focus errors are reduced by for instance a factor of three by reducing the slit width for example from 26 mm to about 8 mm. The non-correctable focus errors are in such case reduced from about 150 nm to about 50 nm.

The image pattern on the patterning device may in such case be split up in for instance three or four parts. The parts are preferably separated by a non-transmitting part that is large enough to accommodate the shielding of the non-projected image parts with shielding elements. Such shielding elements may include, but are not limited to, a rema. Multiple parallel scans with a smaller exposure slit can stitch the total image together on the exposure area.

Embodiments of the present invention reduce the contribution of the wafer surface height differences into the focus budget, since reducing the maximum exposure slit dimension reduces the non-correctable focus errors. Therefore the useable depth of focus (UDOF) of the image system may be reduced by means of stitching several scans together. To improve stitching, the parallel scans preferably overlap on scribe lanes of the substrate.

An embodiment of the present invention was simulated using exposure slits having a width of 30 mm and a length between 1 mm and 30 mm: The non-correctable focus errors prove to be especially depending on the slit length for spatial frequencies below about 150 l/m, or periods larger than about 6.6 mm. Non-limiting examples showed a relatively large decrease of the non-correctable focus errors by decreasing the slit length from 30 mm—i.e., a square 30 mm×30 mm field for a stepper—to a slit length of 10 mm. Decreasing the exposure slit length below 10 mm increases yield and performance even further.

Further tests showed that the dependence of the non-correctable focus errors depend on the slit length is considerable for spatial frequencies below 80 l/m, or for periods larger than about 12.5 mm. Regarding MA errors, the slit length may be reduced to 10 mm. To reduce the MSD error, it is beneficial to reduce the slit length to 2 mm or even 1 mm.

Instead of reducing the slit length, one may also reduce the slit width. The slit width was varied and the non-correctable focus errors were determined as a function of the spatial frequency of the wafer surface topography. Reducing the slit size in the non-scanning direction yields a considerable decrease in the non-correctable focus errors for spatial frequencies having periods larger than the slit size in the scanning direction, i.e., smaller than 150 l/m or 8 mm. Thus, stitching provides an improvement on the leveling performance of an exposure apparatus. Decreasing the slit width reduces the non-correctable focus errors.

A first example of a practical embodiment includes on-the-fly measurement of the wafer surface topography. To measure the surface topography during the exposure of the substrate, the sensors for the topography measurement are arranged in close proximity to the exposure slit. For example, the sensors may be arranged on the blades, or rema blades, forming the exposure slit. If the sensors during a first rough measurement detect a level change in the topography that could possibly lead to a non-correctable focus error (NCE), the field is measured again. The second measurement is more detailed and the process of reducing the exposure slit size according to the present invention is used to correct for the possible NCE.

A second example of a practical embodiment includes off-line measurement. This is for instance suitable for lithographic apparatus having two stages, as described above. While exposing a first substrate that is arranged on the first stage, substantially the complete surface topography of a second substrate that is arranged on the second stage is measured. So substantially the complete substrate topography is known before exposing the substrate. If at certain parts of the substrate non-correctable focus errors are expected, the field and the exposure slit at these parts are reduced to prevent the NCE.

In practice, several algorithms may be used to implement the process of the invention. The following provides therefore a non-limiting example of a practical embodiment of such process. First, the surface topography of the field to be exposed is measured. The field is subsequently arranged in the focal plane of the illuminator using a least-square fit to the measured surface topography. The residues provide the maximum defocus distance. In a next step, these residues are compared with the depth-of-focus (DOF). If the residues are larger than the depth-of-focus, a non-correctable focus error is to be expected. The lithographic apparatus of the invention then reduces the size of the exposure slit, or in other words, splits up the exposure field in two, three or more exposures. The size of the exposure slit is reduced such that the size of the slit is smaller than the distance over which the topography variation equals the depth-of-focus.

It should be noted that the depth of focus depends on several conditions. For instance the DOF differs from one structure to another structure. Examples include memory structures, having a DOF in the order of 150 nm, whereas logical structures may have a DOF in the order of 300 nm.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus, comprising:
   a substrate table constructed to hold a substrate;
   a projection system configured to project a radiation beam through an exposure slit area onto a target portion of the substrate;
   a patterning device being capable of imparting the radiation beam with a pattern in its cross-section to form a patterned radiation beam, the patterned radiation beam at the target portion of the substrate being in focus over a depth of focus (DOF);
   a measurement system that is arranged to measure a surface topography of at least part of the target portion,
   wherein the projection system is arranged to adjust a dimension of the exposure slit area to form an adjusted exposure slit area over which surface topography variations are equal to or smaller than the depth of focus.

2. The lithographic apparatus of claim 1, wherein the projection system is arranged to maximize the dimension of the adjusted exposure slit area by reducing the dimension of the exposure slit area if the surface topography variations over the exposure slit area exceed the depth of focus.

3. The lithographic apparatus of claim 1, wherein the projection system is arranged to maximize the dimension of the adjusted exposure slit area by increasing the dimension of the exposure slit area if the surface topography variations over the exposure slit area are smaller than the depth of focus.

4. The lithographic apparatus of claim 1, wherein the exposure slit area is substantially rectangular, having a width and a length dimension.

5. The lithographic apparatus of claim 4, wherein adjusting the dimension of the exposure slit area includes decreasing at least one of the width and the length dimension of the exposure slit area.

6. The lithographic apparatus of claim 1, wherein the projection system is arranged to reduce at least one of the width and the length dimension of the exposure slit area to a size smaller than the distance over which the surface topography variations equal the depth of focus (DOF).

7. The lithographic apparatus of claim 1, wherein the measurement system is arranged to measure the surface topography of substantially the complete substrate before projecting the radiation beam onto the substrate.

8. The lithographic apparatus of claim 1, wherein the measurement system is arranged to measure the surface topography of a first substrate while the projection system projects the radiation beam onto a second substrate.

9. The lithographic apparatus of claim 1, wherein the measurement system is arranged to measure the surface topography during the projection of the radiation beam onto the substrate.

10. The lithographic apparatus of claim 1, further including at least one actuator to adjust a height of the substrate table.

11. The lithographic apparatus of claim 1, including at least one actuator to adjust a tilt of the substrate table.

12. The lithographic apparatus of claim 1, including at least one actuator that is arranged to, during every exposure, optimize the positioning of the substrate table for that exposure.

13. The lithographic apparatus of claim 1, wherein the dimension of the exposure slit is reduced in a direction perpendicular to a scanning direction.

14. A device manufacturing method comprising:
projecting a patterned beam of radiation through an exposure slit area onto a target portion of a substrate, which substrate is arranged on a substrate table constructed to hold the substrate, the patterned radiation beam being in focus over a depth of focus (DOF);
using a measurement system to measure a surface topography of at least part of the substrate; and
adjusting at least one of a width and a length dimension of the exposure slit area to form an adjusted exposure slit area over which surface topography variations are equal to or smaller than the depth of focus.

15. The method of claim 14, wherein the at least one of the width and the length dimension of the exposure slit area is reduced to a size smaller than the distance over which the surface topography variations equal the depth of focus (DOF).

16. The method of claim 14, comprising dividing a pattern to be projected on the substrate in two or more parts before exposure.

17. The method of claim 16, comprising stitching said parts at scribe lanes.

* * * * *